US012593500B2

(12) United States Patent
Matsui et al.

(10) Patent No.: US 12,593,500 B2
(45) Date of Patent: Mar. 31, 2026

(54) SEMICONDUCTOR DEVICE

(71) Applicant: FUJI ELECTRIC CO., LTD.,
Kawasaki (JP)

(72) Inventors: Toshiyuki Matsui, Matsumoto-city
(JP); Kazuki Kamimura,
Matsumoto-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 640 days.

(21) Appl. No.: 18/055,843

(22) Filed: Nov. 16, 2022

(65) Prior Publication Data

US 2023/0071170 A1      Mar. 9, 2023

Related U.S. Application Data

(63) Continuation of application No.
PCT/JP2021/038976, filed on Oct. 21, 2021.

(30) Foreign Application Priority Data

Dec. 7, 2020    (JP) ................................ 2020-202647

(51) Int. Cl.
*H10D 84/80* (2025.01)
*H10D 8/00* (2025.01)
(Continued)

(52) U.S. Cl.
CPC ............. *H10D 84/811* (2025.01); *H10D 8/00*
(2025.01); *H10D 12/481* (2025.01);
(Continued)

(58) Field of Classification Search
CPC ...... H10D 84/811; H10D 8/00; H10D 12/481;
H10D 62/107; H10D 64/231
(Continued)

(56) References Cited

U.S. PATENT DOCUMENTS

2008/0283867 A1    11/2008  Mori
2016/0111529 A1*   4/2016  Hirabayashi ......... H10D 62/127
                                                257/139
(Continued)

FOREIGN PATENT DOCUMENTS

JP          2008288386 A      11/2008
JP          2013051345 A       3/2013
(Continued)

OTHER PUBLICATIONS

International Search Report and (ISA/237) Written Opinion of the
International Search Authority for International Patent Application
No. PCT/JP2021/038976, mailed by the Japan Patent Office on Dec.
28, 2021.

*Primary Examiner* — Igwe U Anya

(57)            ABSTRACT

Provided is a semiconductor device including a semiconductor substrate having a transistor portion and a diode portion; and an emitter electrode and a gate electrode provided above a front surface of the semiconductor substrate, wherein the transistor portion has a plurality of trench portions electrically connected to the gate electrode, a drift region of a first conductivity type provided in the semiconductor substrate, a base region of a second conductivity type provided above the drift region, and a trench bottom barrier region of a second conductivity type provided between the drift region and the base region and having a higher doping concentration than that of the base region, and the trench bottom barrier region is electrically connected to the emitter electrode.

19 Claims, 13 Drawing Sheets

(51) Int. Cl.

| | |
|---|---|
| *H10D 12/00* | (2025.01) |
| *H10D 62/10* | (2025.01) |
| *H10D 62/17* | (2025.01) |
| *H10D 64/23* | (2025.01) |

(52) U.S. Cl.
CPC ......... *H10D 62/107* (2025.01); *H10D 62/393* (2025.01); *H10D 64/231* (2025.01)

(58) Field of Classification Search
USPC .......................................................... 257/401
See application file for complete search history.

(56) References Cited

U.S. PATENT DOCUMENTS

| | | | |
|---|---|---|---|
| 2016/0240641 A1 | 8/2016 | Okawara | |
| 2017/0098700 A1* | 4/2017 | Yamashita | .......... H10D 12/481 |
| 2017/0222029 A1 | 8/2017 | Kono | |
| 2018/0286971 A1 | 10/2018 | Philippou | |
| 2019/0051648 A1 | 2/2019 | Kakimoto | |
| 2019/0115460 A1* | 4/2019 | Hirabayashi | ......... H10D 12/481 |
| 2019/0123186 A1 | 4/2019 | Philippou | |
| 2020/0357904 A1* | 11/2020 | Ozaki | .................. H10D 64/519 |
| 2021/0210485 A1* | 7/2021 | Umeki | ..................... H10D 8/00 |
| 2022/0013645 A1* | 1/2022 | Shimosawa | .......... H10D 62/127 |
| 2022/0122966 A1* | 4/2022 | Nishi | .................... H10D 8/422 |
| 2022/0328669 A1* | 10/2022 | Mitsuzuka | .......... H10D 64/117 |

FOREIGN PATENT DOCUMENTS

| | | |
|---|---|---|
| JP | 2014175517 A | 9/2014 |
| JP | 2015090917 A | 5/2015 |
| JP | 2017028250 A | 2/2017 |
| JP | 2017135339 A | 8/2017 |
| JP | 2017139328 A | 8/2017 |
| JP | 2018182313 A | 11/2018 |
| JP | 2019091892 A | 6/2019 |

* cited by examiner c–c'

100

100

100

SEMICONDUCTOR DEVICE

The contents of the following Japanese patent application(s) are incorporated herein by reference:

NO. 2020-202647 filed in JP on Dec. 7, 2020, and
NO. PCT/JP2021/038976 filed in WO on Oct. 21, 2021

BACKGROUND

1. Technical Field

The present invention relates to a semiconductor device.

2. Related Art

Conventionally, in a semiconductor device in which a transistor portion such as an insulated gate type bipolar transistor (IGBT) and a diode portion are formed in the same substrate, known is a technology of providing a lifetime control region including a lifetime killer by irradiating particle beams such as helium ions to a predetermined depth position in the semiconductor substrate (for example, Patent Documents 1 and 2).

Patent Document 1: Japanese Patent Application Publication No. 2017-135339

Patent Document 2: Japanese Patent Application Publication No. 2014-175517

Technical Problem

In such a semiconductor device, the lifetime control region is provided not only in the diode portion but also in a region of the transistor portion adjacent to the diode portion, so that hole injection at the time of reverse recovery is suppressed. However, there is a problem that the region of the transistor portion, in which the lifetime control region is provided, becomes an invalid region that does not operate as a transistor.

DESCRIPTION OF EXEMPLARY EMBODIMENTS

Figure 1:
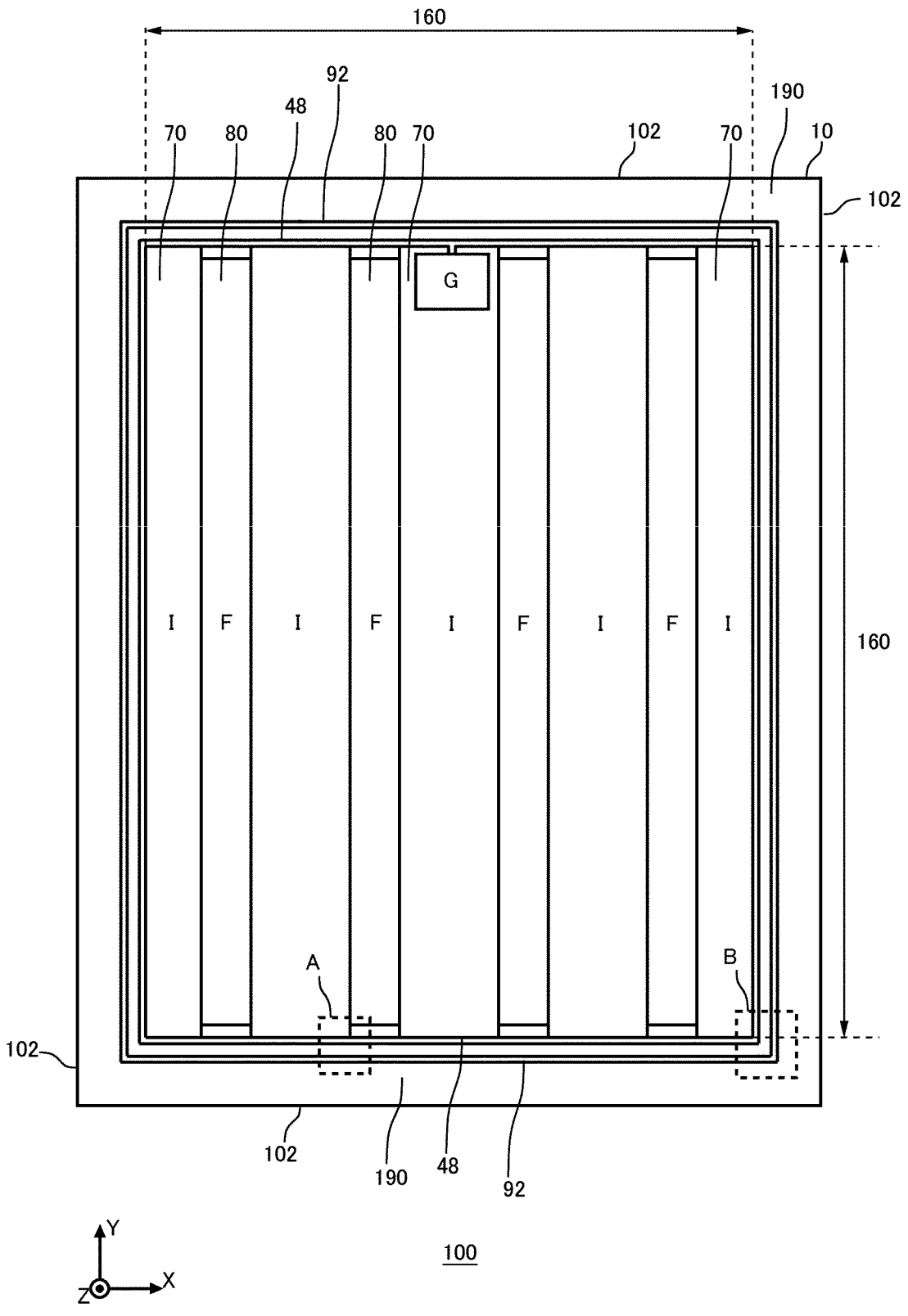
FIG. 1 shows an example of an upper surface of a semiconductor device 100 according to the present embodiment.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to a depth direction of a semiconductor substrate is referred to as 'upper' or 'front' and the other side is referred to as 'lower' or 'rear'. One surface of two principal surfaces of a substrate, a layer or other member is referred to as 'front surface', and the other surface is referred to as 'rear surface'. 'Upper' and 'lower' directions are not limited to a direction of gravity or a direction in which a semiconductor device is mounted.

In the present specification, the technical matters may be described using orthogonal coordinate axes of an X axis, a Y axis and a Z axis. The orthogonal coordinate axes merely specify relative positions of components, and do not limit a specific direction. For example, the Z axis is not limited to indicate a height direction with respect to the ground. Note that, the +Z axis direction and the −Z axis direction are directions opposite to each other. When the Z axis direction is described without the signs, it means that the direction is parallel to the +Z axis and the −Z axis.

In the present specification, orthogonal axes parallel to the front surface and the rear surface of the semiconductor substrate are referred to as the X axis and the Y axis. In addition, an axis perpendicular to the front surface and the rear surface of the semiconductor substrate is referred to as the Z axis. In the present specification, the direction of the Z axis may be referred to as a depth direction. Further, in the present specification, a direction parallel to the front surface and the rear surface of the semiconductor substrate, including an X axis and a Y axis, may be referred to as a horizontal direction.

In the present specification, a case where a term such as "same" or "equal" is described may include a case where an error due to a variation in manufacturing or the like is included. The error is, for example, within 10%.

In the present specification, a conductivity type of a doping region in which an impurity has been doped is described as a P type or an N type. In the present specification, the impurity may particularly mean either a donor of N type or an acceptor of P type, and may be described as a dopant. In the present specification, doping means introducing the donor or the acceptor into the semiconductor substrate and turning it into a semiconductor representing a conductivity type of N type or a semiconductor representing a conductivity type of P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration each other, including polarities of charges. As an example, when the donor concentration is referred to as $N_D$ and the acceptor concentration is referred to as $N_A$, the net doping concentration at any position is given as $N_D$-$N_A$.

The donor has a function of supplying electrons to a semiconductor. The acceptor has a function of receiving electrons from the semiconductor. The donor and the acceptor are not limited to the impurities themselves. For example, a VOH defect that is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

In the present specification, a chemical concentration refers to a density of an impurity measured regardless of an electrical activation state. The chemical concentration can be measured by, for example, secondary ion mass spectrometry (SIMS). The net doping concentration described above can be measured by a voltage-capacitance measurement method (CV method). Further, a carrier density measured by a spreading resistance method (SR method) may be set as the net doping concentration. The carrier density measured by the CV method or the SR method may be set as a value in a thermal equilibrium state. Further, in a region of N type, the donor concentration is sufficiently higher than the acceptor concentration, and therefore, the carrier density in the region may be set as the donor concentration. Similarly, in a region of P type, the carrier density in the region may be set as the acceptor concentration.

Further, when a concentration distribution of the donor, acceptor, or net doping has a peak, a value of the peak may be set as the concentration of the donor, acceptor, or net doping in the region. In a case where the concentration of the donor, acceptor or net doping is substantially uniform, or the like, an average value of the concentration of the donor, acceptor or net doping in the region may be set as the concentration of the donor, acceptor or net doping.

The carrier concentration measured by the SR method may be lower than the concentration of the donor or the acceptor. In a range where a current flows at the time when measuring a spreading resistance, carrier mobility of the semiconductor substrate may be lower than a value in a crystalline state. The reduction in carrier mobility occurs when carriers are scattered due to disorder of a crystal structure due to a lattice defect or the like.

The concentration of the donor or the acceptor calculated from the carrier density measured by the CV method or the SR method may be lower than a chemical concentration of an element representing the donor or the acceptor. As an example, in a silicon semiconductor, a donor concentration of phosphorous or arsenic serving as a donor, or an acceptor concentration of boron serving as an acceptor is approximately 99% of their chemical concentrations. On the other hand, in the silicon semiconductor, a donor concentration of hydrogen serving as a donor is approximately 0.1% to 10% of a chemical concentration of hydrogen.

FIG. 1 shows an example of an upper surface of a semiconductor device 100 according to one embodiment of the present invention. FIG. 1 shows a position at which each member is projected onto a front surface of a semiconductor substrate 10. In FIG. 1, only some members of the semiconductor device 100 are shown, and illustrations of some members are omitted.

The semiconductor device 100 includes a semiconductor substrate 10. The semiconductor substrate 10 has an end side 102 in a top view. In the present specification, when simply referred to as a top view, it means that the semiconductor substrate 10 is seen from a front surface side. The semiconductor substrate 10 of the present example has two sets of end sides 102 facing each other in the top view. In FIG. 1, the X axis and the Y axis are parallel to any of the end sides 102. In addition, the Z axis is perpendicular to the front surface of the semiconductor substrate 10.

The semiconductor substrate 10 is provided with an active region 160. The active region 160 is a region in which a main current flows in a depth direction between the front surface and the rear surface of the semiconductor substrate 10 when the semiconductor device 100 operates. An emitter electrode is provided above the active region 160, but its illustration is omitted in FIG. 1.

The active region 160 is provided with at least one of a transistor portion 70 including a transistor element such as an IGBT, or a diode portion 80 including a diode element such as a freewheeling diode (FWD). In the example of FIG. 1, the transistor portion 70 and the diode portion 80 are alternately arranged along a predetermined array direction (X axis direction, in the present example) on the front surface of the semiconductor substrate 10. In another example, the active region 160 may be provided with only one of the transistor portion 70 and the diode portion 80.

In FIG. 1, a region in which the transistor portion 70 is arranged is denoted with a symbol "I", and a region in which the diode portion 80 is arranged is denoted with a symbol "F". In the present specification, a direction perpendicular to the array direction in the top view may be referred to as an extension direction (Y axis direction, in FIG. 1). The transistor portion 70 and the diode portion 80 may each have a longitudinal length in the extension direction. That is, a length of the transistor portion 70 in the Y axis direction is greater than a width in the X axis direction. Similarly, a length of the diode portion 80 in the Y axis direction is greater than a width in the X axis direction. The extension directions of the transistor portion 70 and the diode portion 80 may be the same as a longitudinal direction of each trench portion which will be described later.

The diode portion 80 has a cathode region of N+ type in a region in contact with the rear surface of the semiconductor substrate 10. In the present specification, the region in which the cathode region is provided is referred to as the diode portion 80. That is, the diode portion 80 is a region overlapping the cathode region in the top view. The rear surface of the semiconductor substrate 10 may be provided with a collector region of P+ type in a region other than the cathode region. In the present specification, the diode portion 80 may also include an extension region where the diode portion 80 is extended to a gate runner described below in the Y axis direction. A lower surface of the extension region is provided with the collector region.

The transistor portion 70 has the collector region of P+ type in a region in contact with the rear surface of the semiconductor substrate 10. Further, in the transistor portion 70, an emitter region of N type, a base region of P type, and a gate structure having a gate conductive portion and a gate dielectric film are periodically arranged on the front surface side of the semiconductor substrate 10.

The semiconductor device 100 may have one or more pads above the semiconductor substrate 10. As an example, the semiconductor device 100 shown in FIG. 1 has a gate pad G, which is, however, only an example. The semiconductor device 100 may include a pad such as an anode pad, a cathode pad, and a current detection pad. Each pad is arranged in a region close to the end side 102. The region close to the end side 102 refers to a region between the end side 102 and the emitter electrode in the top view. When the semiconductor device 100 is mounted, each pad may be connected to an external circuit via a wiring such as a wire.

A gate potential is applied to the gate pad G. The gate pad G is electrically connected to a conductive portion of a gate trench portion of the active region 160. The semiconductor device 100 includes a gate runner 48 configured to electrically connect the gate pad G and the gate trench portion.

The gate runner 48 is arranged between the active region 160 and the end side 102 of the semiconductor substrate 10 in the top view. The gate runner 48 of the present example is configured to enclose the active region 160 in the top view. A region enclosed by the gate runner 48 in the top view may be the active region 160.

The gate runner 48 is arranged above the semiconductor substrate 10. The gate runner 48 of the present example may be formed of polysilicon doped with impurities, or the like. The gate runner 48 is electrically connected to the gate conductive portion provided in the gate trench portion via a gate dielectric film.

The semiconductor device 100 of the present example includes an edge termination structure portion 190 between the active region 160 and the end side 102. The edge termination structure portion 190 of the present example is arranged between the gate runner 48 and the end side 102. The edge termination structure portion 190 is configured to reduce electric field concentration on the front surface side of the semiconductor substrate 10.

The edge termination structure portion 190 may have a guard ring 92. The guard ring 92 is a region of P type in contact with the front surface of the semiconductor substrate 10. Note that, although the edge termination structure portion 190 of the present example has a plurality of guard rings 92, their illustrations are omitted and only one guard ring 92 is shown in FIG. 1. By providing the plurality of guard rings 92, a depletion layer on the upper surface side of the active region 160 can be extended outward, so that a breakdown voltage of the semiconductor device 100 can be improved. The edge termination structure portion 190 may further include at least one of a field plate or a RESURF, which is annularly provided enclosing the active region 160.

Further, the semiconductor device 100 may include a temperature sensing portion (not shown) that is a PN junction diode formed of polysilicon or the like, and a current detection portion (not shown) configured to operate similarly to the transistor portion provided in the active region 160.

Figure 2A:
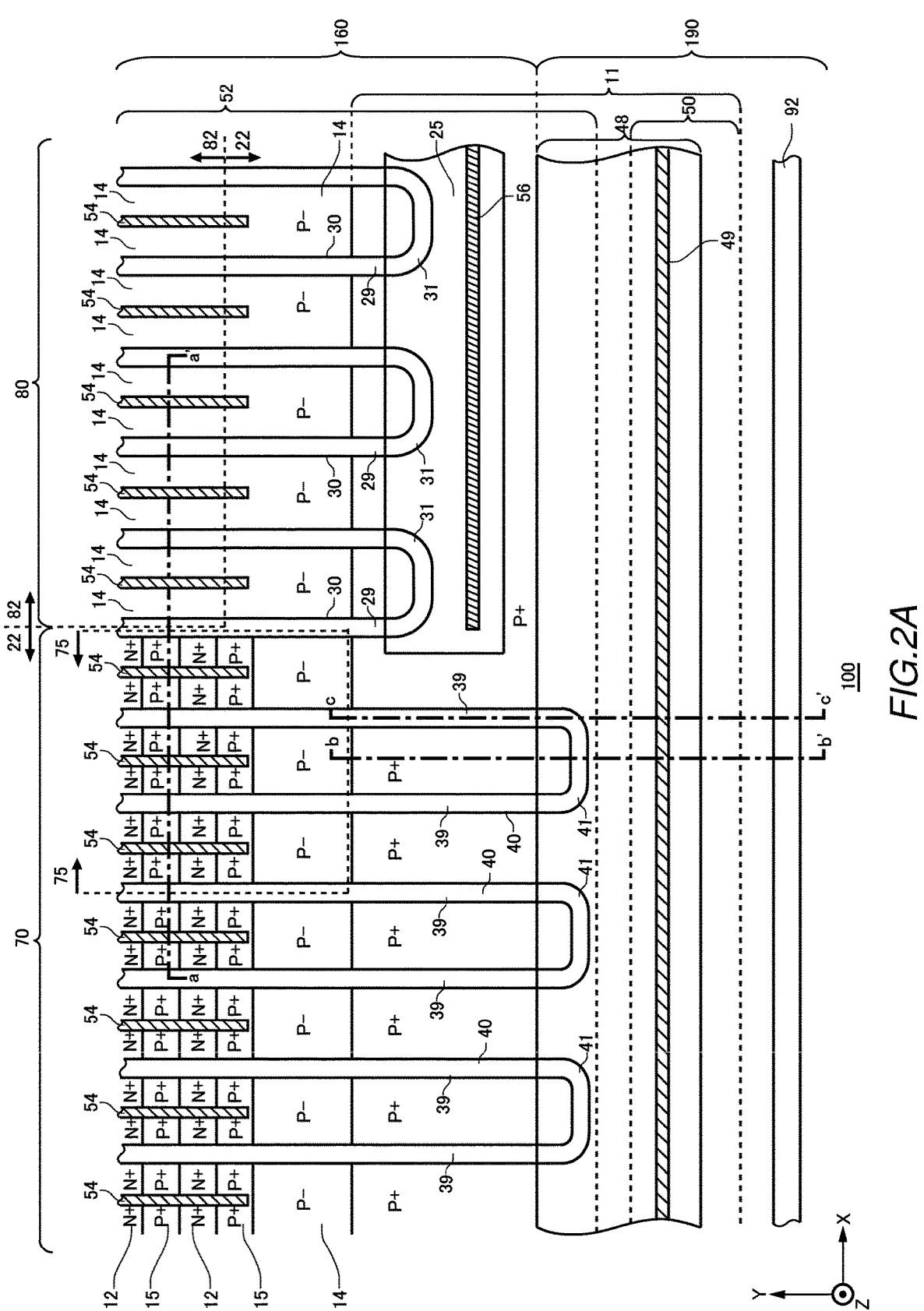
FIG. 2A is an enlarged view showing an example of a region A in FIG. 1.

FIG. 2A is an enlarged view showing an example of a region A in FIG. 1. The semiconductor device 100 includes the semiconductor substrate having the transistor portion 70 including a transistor element such as an IGBT and the diode portion 80 including a diode element such as a freewheeling diode (FWD).

The semiconductor device 100 of the present example includes a gate trench portion 40, a dummy trench portion 30, a well region 11, an emitter region 12, a base region 14, and a contact region 15 provided inside the front surface side of the semiconductor substrate. Each of the gate trench portion 40 and the dummy trench portion 30 is an example of the trench portion.

In addition, the semiconductor device 100 of the present example includes a gate metal layer 50 and an emitter electrode 52 provided above the front surface of the semiconductor substrate. The gate metal layer 50 and the emitter electrode 52 are provided separately from each other. The gate metal layer 50 and the emitter electrode 52 are electrically insulated.

An interlayer dielectric film is provided between the emitter electrode 52 and gate metal layer 50 and the front surface of the semiconductor substrate, but its illustration is omitted in FIG. 1. In the interlayer dielectric film of the present example, contact holes 49, 54 and 56 are provided penetrating through the interlayer dielectric film. In FIG. 1, each contact hole is diagonally hatched.

The emitter electrode 52 is provided above the gate trench portion 40, the dummy trench portion 30, the well region 11, the emitter region 12, the base region 14 and the contact region 15. The emitter electrode 52 is electrically connected to the emitter region 12, the base region 14 and the contact region 15 on the front surface of the semiconductor substrate through the contact hole 54.

In addition, the emitter electrode 52 is connected to a dummy conductive portion in the dummy trench portion 30 by the contact hole 56. Between the emitter electrode 52 and the dummy conductive portion, a connection portion 25 formed of a conductive material such as polysilicon doped with impurities may be provided. The connection portion 25 is provided on the front surface of the semiconductor substrate via a dielectric film such as an interlayer dielectric film and a dummy dielectric film of the dummy trench portion 30.

The gate metal layer 50 is electrically connected to the gate runner 48 through the contact hole 49. The gate runner 48 may be formed of polysilicon doped with impurities, or the like. The gate runner 48 is connected to a gate conductive portion in the gate trench portion 40 in the front surface of the semiconductor substrate. The gate runner 48 is not electrically connected to the dummy conductive portion in the dummy trench portion 30 and the emitter electrode 52.

The gate runner 48 and the emitter electrode 52 are electrically separated by an insulating material such as an interlayer dielectric film and an oxide film. The gate runner 48 of the present example is provided from below the contact hole 49 to an edge portion of the gate trench portion 40. At the edge portion of the gate trench portion 40, the gate conductive portion is exposed on the front surface of the semiconductor substrate and is connected to the gate runner 48.

The emitter electrode 52 and the gate metal layer 50 are formed of a conductive material including metal. For example, they are formed of aluminum or an aluminum-silicon alloy. Each electrode may have a barrier metal formed of titanium, a titanium compound, or the like in a lower layer of a region formed of aluminum or the like.

Each electrode may have a plug formed of tungsten or the like in the contact hole. The plug may have a barrier metal on a side in contact with the semiconductor substrate, and tungsten may be embedded in the plug so as to be in contact with the barrier metal. Each electrode may be formed by forming a film of aluminum or the like on tungsten.

Note that, the plug is provided in the contact hole in contact with the contact region 15 or the base region 14. In addition, a plug region 17 of P++ type is formed under the contact hole of the plug, and has a doping concentration higher than that of the contact region 15. This can improve a contact resistance between the barrier metal and the contact region 15. Further, a depth of the plug region 17 is about 0.1 μm or less, and has a small region with a depth of 10% or less of that of the contact region 15.

The plug region 17 has following features. In an operation of the transistor portion 70, a latch-up resistance is improved by improvement on the contact resistance. On the other hand, in an operation of the diode portion 80, when the plug region 17 is not present, a contact resistance between the barrier metal and the base region 14 is high, and the conduction loss and the switching loss increase. However, it is possible to suppress the increases in conduction loss and switching loss by providing the plug region 17 in the diode portion 80.

The well region 11 extends along an outer circumference of the active region 160 while overlapping the gate runner 48 and is annularly provided in the top view. The well region 11 extends in a predetermined width even within a range that does not overlap the gate runner 48 and is annularly provided in the top view. The well region 11 of the present example is provided away from an end of the contact hole 54 in the Y axis direction toward the gate runner 48. The well region 11 is a region of a second conductivity type having a higher doping concentration than that of the base region 14. The gate runner 48 is electrically insulated from the well region 11.

In the present example, the base region 14 is P-type, and the well region 11 is P+ type. In addition, the well region 11 is formed from the front surface of the semiconductor substrate to a position deeper than a lower end of the base region 14. The base region 14 is provided in contact with the well region 11 in the transistor portion 70 and the diode portion 80. Therefore, the well region 11 is electrically connected to the emitter electrode 52.

Each of the transistor portion 70 and the diode portion 80 has a plurality of trench portions arrayed in the array direction. In the transistor portion 70 of the present example, one or more gate trench portions 40 are provided along the array direction. In the diode portion 80 of the present example, a plurality of dummy trench portions 30 are provided along the array direction. In the diode portion 80 of the present example, the gate trench portion 40 is not provided.

The gate trench portion 40 of the present example may have two linear portions 39 (portions of the trench that are linear along the extension direction) extending along the extension direction perpendicular to the array direction and an edge portion 41 connecting the two linear portions 39.

At least a part of the edge portion 41 may be provided in a curved shape in the top view. The edge portion 41 connects the end portions of the two linear portions 39 in the Y axis direction to the gate runner 48, which functions as a gate electrode to the gate trench portion 40. On the other hand, by forming the edge portion 41 into a curved shape, electric field concentration at the end portions can be further reduced, as compared with a case where the gate trench portion 40 is completed with the linear portions 39.

In the transistor portion 70 of another example, one or more gate trench portions 40 and one or more dummy trench portions 30 may be alternately provided along the array direction. In the transistor portion 70, the dummy trench portion 30 is provided between the respective linear portions 39 of the gate trench portion 40. One dummy trench portion 30 or a plurality of dummy trench portions 30 may be provided between the respective linear portions 39.

In addition, the dummy trench portion 30 may not be provided and the gate trench portion 40 may be provided between the respective linear portions 39. With such a structure, the electron current from the emitter region 12 can be increased, so that an on-voltage is reduced.

The dummy trench portion 30 may have a linear shape extending in the extension direction, and may have linear portions 29 and an edge portion 31, similar to the gate trench portion 40. In the semiconductor device 100 shown in FIG. 2A, only the dummy trench portions 30 having the edge portions 31 are arrayed. However, in another example, the semiconductor device 100 may include the linear dummy trench portion 30 without the edge portion 31.

A diffusion depth of the well region 11 may be greater than depths of the gate trench portion 40 and the dummy trench portion 30. The end portions of the gate trench portion 40 and the dummy trench portion 30 in the Y axis direction are provided in the well region 11 in the top view. That is, at the end portion of each trench portion in the Y axis direction, a bottom portion of each trench portion in the depth direction is covered with the well region 11. Thereby, the electric field concentration on the bottom portion of each trench portion can be reduced.

A mesa portion is provided between the respective trench portions in the array direction. The mesa portion refers to a region sandwiched between the trench portions in the semiconductor substrate. As an example, a depth position of the mesa portion is from the front surface of the semiconductor substrate to the lower end of the trench portion.

The mesa portion of the present example is sandwiched between the adjacent trench portions in the X axis direction, and is provided extending in the extension direction (Y axis direction) along the trench in the front surface of the semiconductor substrate. As described later with reference to FIG. 2B, in the present example, the transistor portion 70 is provided with a mesa portion 60, and the diode portion 80 is provided with a mesa portion 61. In the present specification, when simply referred to as the mesa portion, the portion refers to each of the mesa portion 60 and the mesa portion 61.

Each mesa portion is provided with the base region 14. In each mesa portion, at least one of the emitter region 12 of the first conductivity type or the contact region 15 of the second conductivity type may be provided in a region sandwiched between the base regions 14 in the top view. In the present example, the emitter region 12 is N+ type, and the contact region 15 is P+ type. The emitter region 12 and the contact region 15 may be provided between the base region 14 and the front surface of the semiconductor substrate in the depth direction.

The mesa portion of the transistor portion 70 has an emitter region 12 exposed on the front surface of the semiconductor substrate. The emitter region 12 is provided in contact with the gate trench portion 40. The mesa portion in contact with the gate trench portion 40 is provided with the contact region 15 exposed on the front surface of the semiconductor substrate.

Each of the contact region 15 and the emitter region 12 in the mesa portion is provided from one trench portion to the other trench portion in the X axis direction. As an example, the contact region 15 and the emitter region 12 of the mesa portion are alternately arranged along the extension direction (Y axis direction) of the trench portion.

In another example, the contact region 15 and the emitter region 12 of the mesa portion may be provided in a stripe shape along the extension direction (Y axis direction) of the trench portion. For example, the emitter region 12 is provided in a region in contact with the trench portion, and the contact region 15 is provided in a region sandwiched between the emitter regions 12.

The mesa portion of the diode portion 80 is not provided with the emitter region 12. An upper surface of the mesa portion of the diode portion 80 may be provided with the base region 14. The base region 14 may be arranged in the entire mesa portion of the diode portion 80.

The contact hole 54 is provided above each mesa portion. The contact hole 54 is arranged in a region sandwiched between the base regions 14 in its extension direction (Y axis direction). The contact hole 54 of the present example is provided above each of the contact region 15, the base region 14 and the emitter region 12. The contact hole 54 may be arranged at a center of the mesa portion in the array direction (X-axis direction).

In the diode portion 80, a region adjacent to the rear surface of the semiconductor substrate is provided with the cathode region 82 of N+ type. In the rear surface of the semiconductor substrate, a region in which the cathode region 82 is not provided may be provided with the collector region 22 of P+ type. In FIG. 2A, a boundary between the cathode region 82 and the collector region 22 is indicated by a dotted line.

The cathode region 82 is arranged away from the well region 11 in the Y axis direction. Thereby, a distance between the region of P type (well region 11), which has a relatively high doping concentration and is formed to a deep position, and the cathode region 82 is secured, so that it is possible to suppress hole injection from the well region 11, thereby reducing a reverse recovery loss. In the present example, an end portion of the cathode region 82 in the Y axis direction is arranged farther away from the well region 11 than an end portion of the contact hole 54 in the Y axis direction. In another example, the end portion of the cathode region 82 in the Y axis direction may be arranged between the well region 11 and the contact hole 54.

The transistor portion 70 includes a trench bottom barrier region 75 of a second conductivity type having a higher doping concentration than that of the base region 14 between a drift region, which will be described later, and the base region 14. The trench bottom barrier region 75 of the present example is P type. In FIG. 2A, a range of the trench bottom barrier region 75 is indicated by a dotted line.

The trench bottom barrier region 75 of the present example is provided in a region adjacent to the diode portion 80 in the top view of the semiconductor substrate. The region adjacent to the diode portion 80 is an end portion region in the array direction (X axis direction) of the transistor portions 70, and refers to a region in direct contact with the diode portion 80 at a boundary with the diode portion 80 extending in the extension direction (Y axis direction). In addition, the trench bottom barrier region 75 is in contact with the well region 11 at an end portion in the Y axis direction.

Figure 2B:
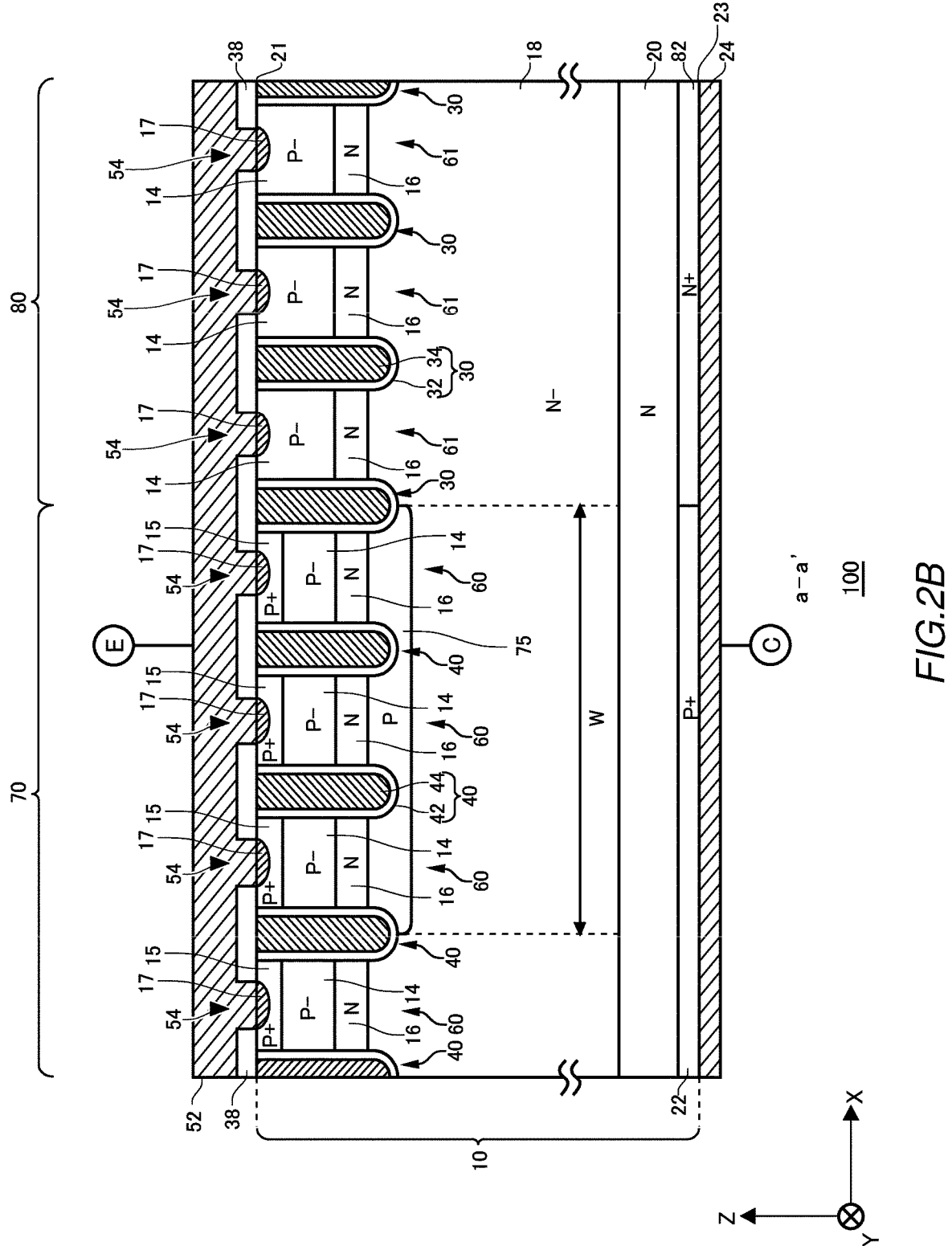
FIG. 2B shows a cross section a-a' in FIG. 2A.

FIG. 2B shows a cross section a-a' in FIG. 2A. The cross-section a-a' is an XZ plane passing through the contact region 15, the base region 14, as well as the gate trench portion 40 and the dummy trench portion 30. In the cross section a-a', the semiconductor device 100 of the present example has the semiconductor substrate 10, an interlayer dielectric film 38, an emitter electrode 52, and a collector electrode 24.

The interlayer dielectric film 38 is provided on a front surface 21 of the semiconductor substrate 10. The interlayer dielectric film 38 is a dielectric film such as silicate glass added with impurities such as boron or phosphorus. The interlayer dielectric film 38 may be in contact with the front surface 21, or another film such as an oxide film may be provided between the interlayer dielectric film 38 and the front surface 21. The interlayer dielectric film 38 is provided with the contact hole 54 described with reference to FIG. 2A.

The emitter electrode 52 is provided on the front surface 21 of the semiconductor substrate 10 and an upper surface of the interlayer dielectric film 38. The emitter electrode 52 is electrically connected to the front surface 21 through the contact hole 54 of the interlayer dielectric film 38. A plug formed of tungsten (W) or the like may be provided in the contact hole 54. The collector electrode 24 is provided on a rear surface 23 of the semiconductor substrate 10. The emitter electrode 52 and the collector electrode 24 are formed of a material including metal or a laminated film thereof.

The semiconductor substrate 10 may be a silicon substrate, a silicon carbide substrate, a nitride semiconductor substrate such as gallium nitride, or the like. In the present example, the semiconductor substrate 10 is a silicon substrate.

The semiconductor substrate 10 has a drift region 18 of a first conductivity type. The drift region 18 of the present example is N-type. The drift region 18 may be a remaining region in the semiconductor substrate 10, in which other doping regions are not provided.

Above the drift region 18, one or more accumulation regions 16 may be provided in the Z axis direction. The accumulation region 16 is a region in which the same dopant as the drift region 18 is accumulated at a higher concentration than that of the drift region 18. A doping concentration of the accumulation region 16 is higher than that of the drift region 18.

The accumulation region 16 of the present example is N type. The accumulation region 16 may be provided only in the transistor portion 70 or in both the transistor portion 70 and the diode portion 80. By providing the accumulation region 16, it is possible to improve a carrier injection enhancement effect (IE effect) and to reduce an on-voltage.

In the transistor portion 70, above the base region 14, the emitter region 12 is provided in contact with the front surface 21. The emitter region 12 is provided in contact with the gate trench portion 40. A doping concentration of the emitter region 12 is higher than that of the drift region 18. The dopant of the emitter region 12 is, for example, arsenic (As), phosphorus (P), antimony (Sb), or the like.

The diode portion 80 is provided with the base region 14 exposed on the front surface 21. The base region 14 of the diode portion 80 operates as an anode.

A buffer region 20 of a first conductivity type may be provided below the drift region 18. The buffer region 20 of the present example is N type. A doping concentration of the buffer region 20 is higher than that of the drift region 18. The buffer region 20 may function as a field stopper layer configured to prevent a depletion layer expanding from a lower surface side of the base region 14 from reaching the collector region 22 and the cathode region 82.

In the transistor portion 70, the collector region 22 is provided below the buffer region 20. The collector region 22 may be provided in contact with the cathode region 82 in the rear surface 23.

In the diode portion 80, the cathode region 82 is provided below the buffer region 20. The cathode region 82 may be provided at the same depth as the collector region 22 of the transistor portion 70. The diode portion 80 may function as a freewheeling diode (FWD) configured to pass a freewheeling current that conducts in a reverse direction, when the transistor portion 70 is turned off.

The semiconductor substrate portion 10 is provided with the gate trench portion 40 and the dummy trench portion 30. The gate trench portion 40 and the dummy trench portion 30 are provided so as to penetrate through the base region 14 and the accumulation region 16 from the front surface 21 and to reach the drift region 18. The configuration of the trench portion penetrating through the doping region is not limited to the one manufactured in the order of forming the doping region and then forming the trench portion. The configuration of the trench portion penetrating through the doping region includes a configuration of the doping region being formed between the trench portions after forming the trench portions.

The gate trench portion 40 includes a gate trench provided in the front surface 21, a gate dielectric film 42, and a gate conductive portion 44. The gate dielectric film 42 is provided covering an inner wall of the gate trench. The gate dielectric film 42 may be formed of an oxide film or a nitride film. The gate conductive portion 44 is provided to embed a more inner side than the gate dielectric film 42 in the gate trench. An upper surface of the gate conductive portion 44 may be in the same XY plane as the front surface 21. The gate dielectric film 42 is configured to insulate the gate conductive portion 44 and the semiconductor substrate 10. The gate conductive portion 44 is formed of polysilicon doped with impurities, or the like.

The gate conductive portion 44 may be provided longer than the base region 14 in the depth direction. The gate trench portion 40 is covered by the interlayer dielectric film 38 on the front surface 21. When a predetermined gate voltage is applied to the gate conductive portion 44, a channel is formed by an electron inversion layer in a surface layer of the base region 14 at a boundary in contact with the gate trench.

The dummy trench portion 30 may have the same structure as the gate trench portion 40 in the cross section XZ. The dummy trench portion 30 includes a dummy trench provided in the front surface 21, a dummy dielectric film 32, and a dummy conductive portion 34. The dummy dielectric film 32 is provided covering an inner wall of the dummy trench. The dummy dielectric film 32 may be formed of an oxide film or a nitride film. The dummy conductive portion 34 is provided to embed a more inner side than the dummy dielectric film 32 in the dummy trench. An upper surface of the dummy conductive portion 34 may be in the same XY plane as the front surface 21. The dummy dielectric film 32 is configured to insulate the dummy conductive portion 34 and the semiconductor substrate 10. The dummy conductive portion 34 may be formed of the same material as the gate conductive portion 44.

In the present example, the gate trench portion 40 and the dummy trench portion 30 are covered by the interlayer dielectric film 38 on the front surface 21. Note that, bottom portions of the dummy trench portion 30 and the gate trench portion 40 may each have a downwardly convex curved shape (a curve shape in a cross section).

In the transistor portion 70, the trench bottom barrier region 75 of P type is provided in a region adjacent to the diode portion 80. The trench bottom barrier region 75 of the present example is provided below the accumulation region 16. A doping concentration of the trench bottom barrier region 75 is 1E11 cm$^{-3}$ or more and 1E13 cm$^{-3}$ or less.

A width W of the trench bottom barrier region 75 in the X axis direction is 2 μm or more and 100 μm or less. The width W of the trench bottom barrier region 75 may be 10 μm or more and 50 μm or less. In FIG. 2B, an end portion of the trench bottom barrier region 75 on a positive side (diode portion 80 side) in the X axis direction coincides with a boundary between the cathode region 82 and the collector region 22, but may be further extended to the diode portion 80 side than the boundary or may be retreated into the transistor portion 70.

In the depth direction of the semiconductor substrate 10, a lower end of the trench bottom barrier region 75 is positioned below the bottom portion of the gate trench portion 40. In other words, the trench bottom barrier region 75 is configured to cover the bottom portion of the gate trench portion 40.

Note that, in the diode portion 80, a lifetime control region including a lifetime killer may be provided locally in the drift region 18. The lifetime control region promotes recombination of holes generated in the base region 14 and electrons injected from the cathode region 82 when the diode portion 80 is turned off, thereby suppressing a peak current at the time of reverse recovery. The lifetime control region may be formed by irradiating protons or helium from the front surface 21 or the rear surface 23.

Figure 2C:
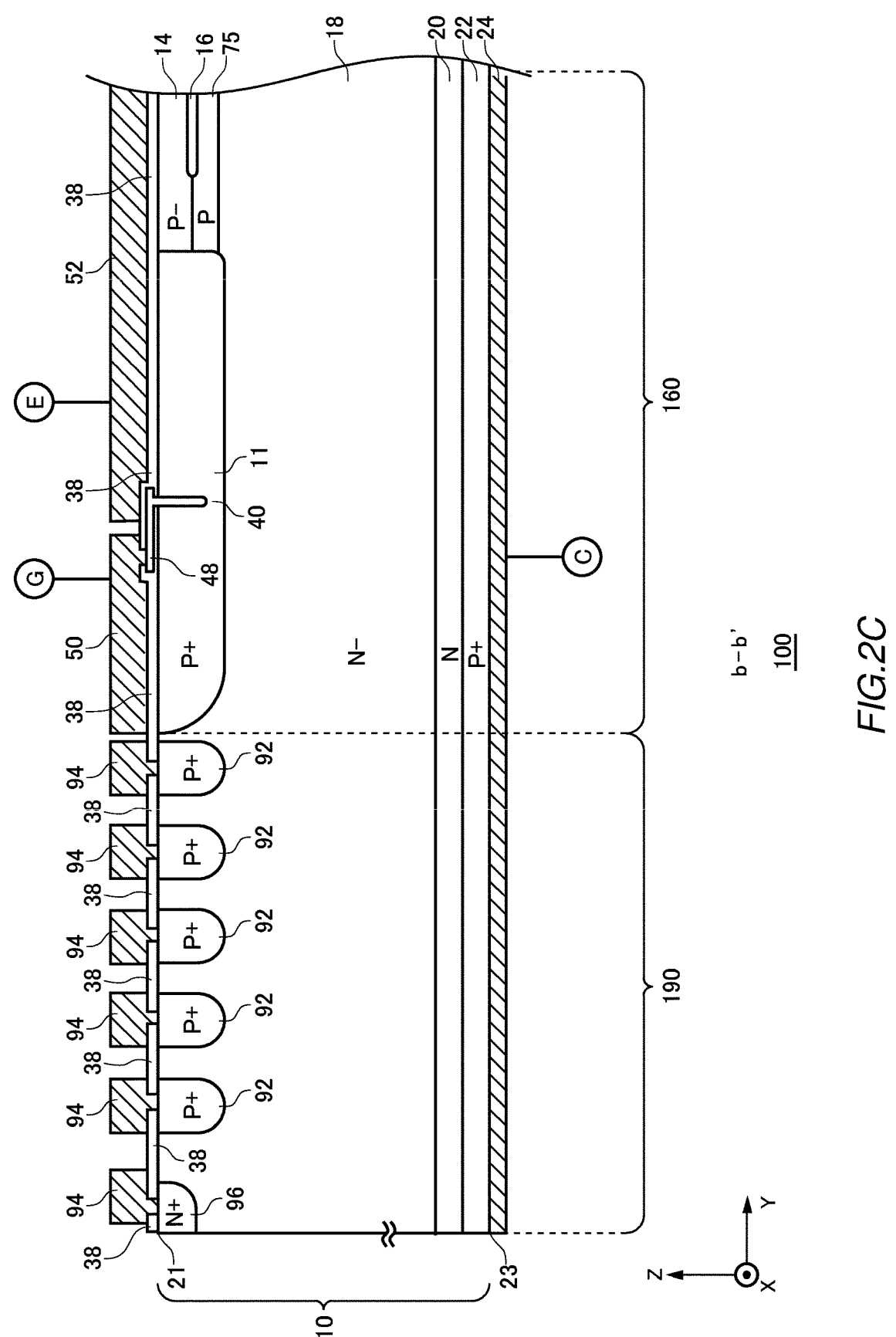
FIG. 2C shows a cross section b-b' in FIG. 2A.

FIG. 2C shows a cross section b-b' in FIG. 2A. The cross section b-b' is a YZ plane passing through the mesa portion 60 in a region of the transistor portion 70 in which the trench bottom barrier region 75 is provided. The cross section b-b' is a cross section of a region spanning the active region 160 and the edge termination structure portion 190. The edge termination structure portion 190 of the present example has a guard ring structure and a channel stopper structure.

The guard ring structure may include a plurality of guard rings 92. The guard ring structure of the present example includes five guard rings 92. Each guard ring 92 may be provided to enclose the active region 160 in the front surface 21.

The guard ring structure may have a function of expanding a depletion layer generated in the active region 160 toward an outer side of the semiconductor substrate 10. Thereby, the electric field concentration in the semiconductor substrate 10 can be prevented. For this reason, as compared with a case where the guard ring structure is not provided, the withstand voltage of the semiconductor device 100 can be improved.

The guard ring 92 is a semiconductor region of P+ type formed in the vicinity of the front surface 21 by ion implantation. The guard ring 92 is electrically connected to a field plate 94. The field plate 94 may be made of the same material as the gate metal layer 50 or the emitter electrode 52.

The plurality of guard rings 92 are electrically insulated from one another by the interlayer dielectric film 38. A depth of a bottom portion of the guard ring 92 may be the same as that of the bottom portion of the well region 11. The depth of the bottom portion of the guard ring 92 may be greater than the depth of the bottom portion of the gate trench portion 40.

The channel stopper structure has a channel stopper 96 and a field plate 94. The channel stopper 96 is electrically connected to the field plate 94 through an opening of the interlayer dielectric film 38. A conductivity type of the channel stopper 96 may be a first conductivity type or a second conductivity type. The conductivity type of the channel stopper 96 of the present example is N+ type. The channel stopper 96 has a function of terminating a depletion layer generated in the active region 160 at an end portion on an outer side of the semiconductor substrate 10.

The trench bottom barrier region 75 is connected to the well region 11 at an end portion in the Y axis direction. A depth of the bottom portion of the well region 11 may be deeper than a lower end of the trench bottom barrier region 75.

The trench bottom barrier region 75 is in contact with the base region 14 at an end portion in the Y axis direction. The base region 14 is connected to the well region 11 at an end portion in the Y axis direction.

In addition, a dielectric film such as an interlayer dielectric film or a gate dielectric film is provided between a lower surface of the gate runner 48 and the well region 11, so that the gate runner 48 and the well region 11 are not electrically connected.

Figure 2D:
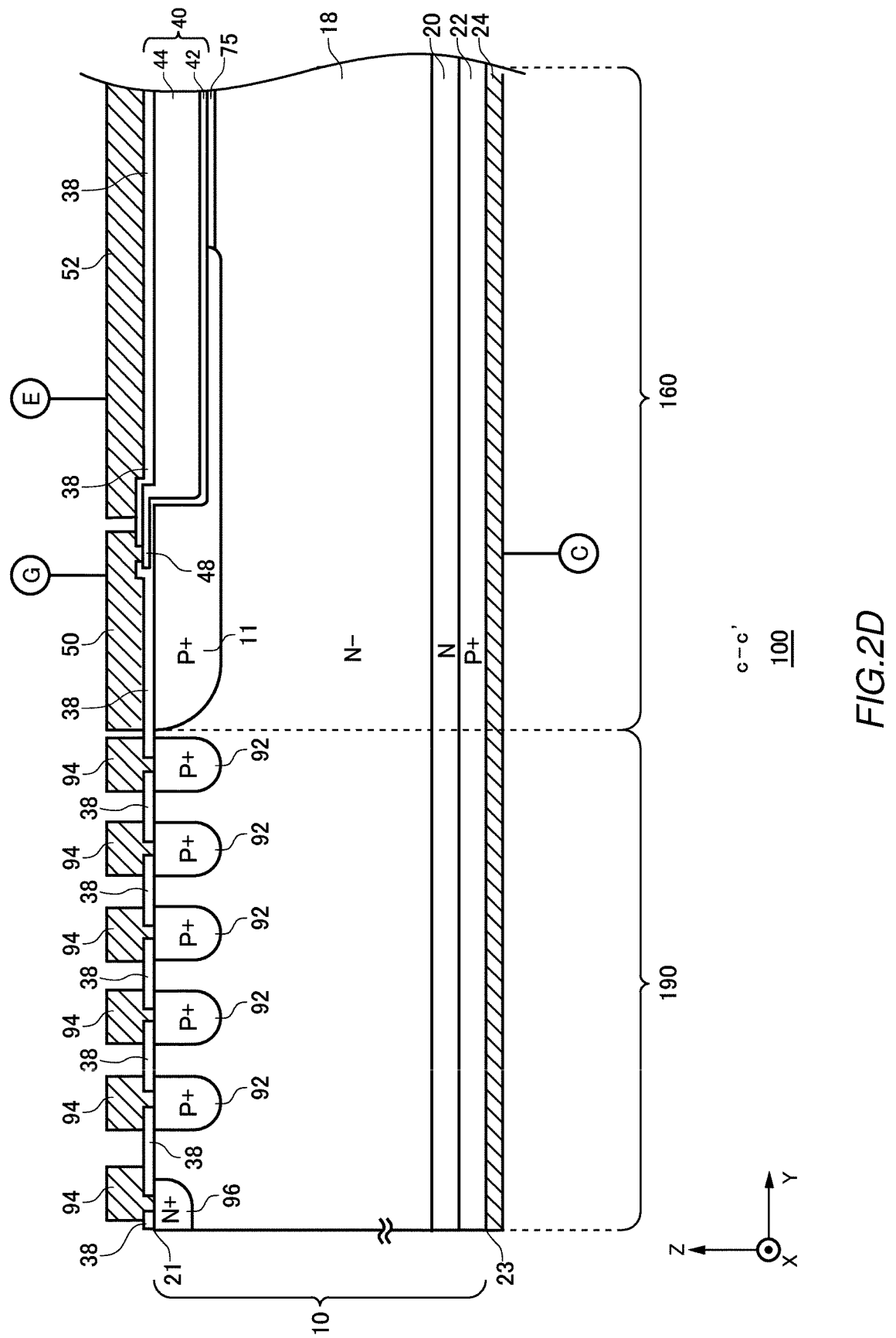
FIG. 2D shows a cross section c-c in FIG. 2A.

FIG. 2D shows a cross section c-c' in FIG. 2A. The cross-section c-c' is a YZ plane passing through the gate trench portion 40 in the longitudinal direction (extension direction) in a region of the transistor portion 70 in which the trench bottom barrier region 75 is provided. In FIG. 2D, elements other than the gate trench portion 40 are common to FIG. 2C.

An end portion of the gate trench portion 40 on a negative side in the Y axis direction is covered by the well region 11. In addition, the bottom portion of the gate trench portion 40 is entirely covered by the trench bottom barrier region 75 on a positive side with respect to the well region 11 in the Y axis direction.

Figure 3A:
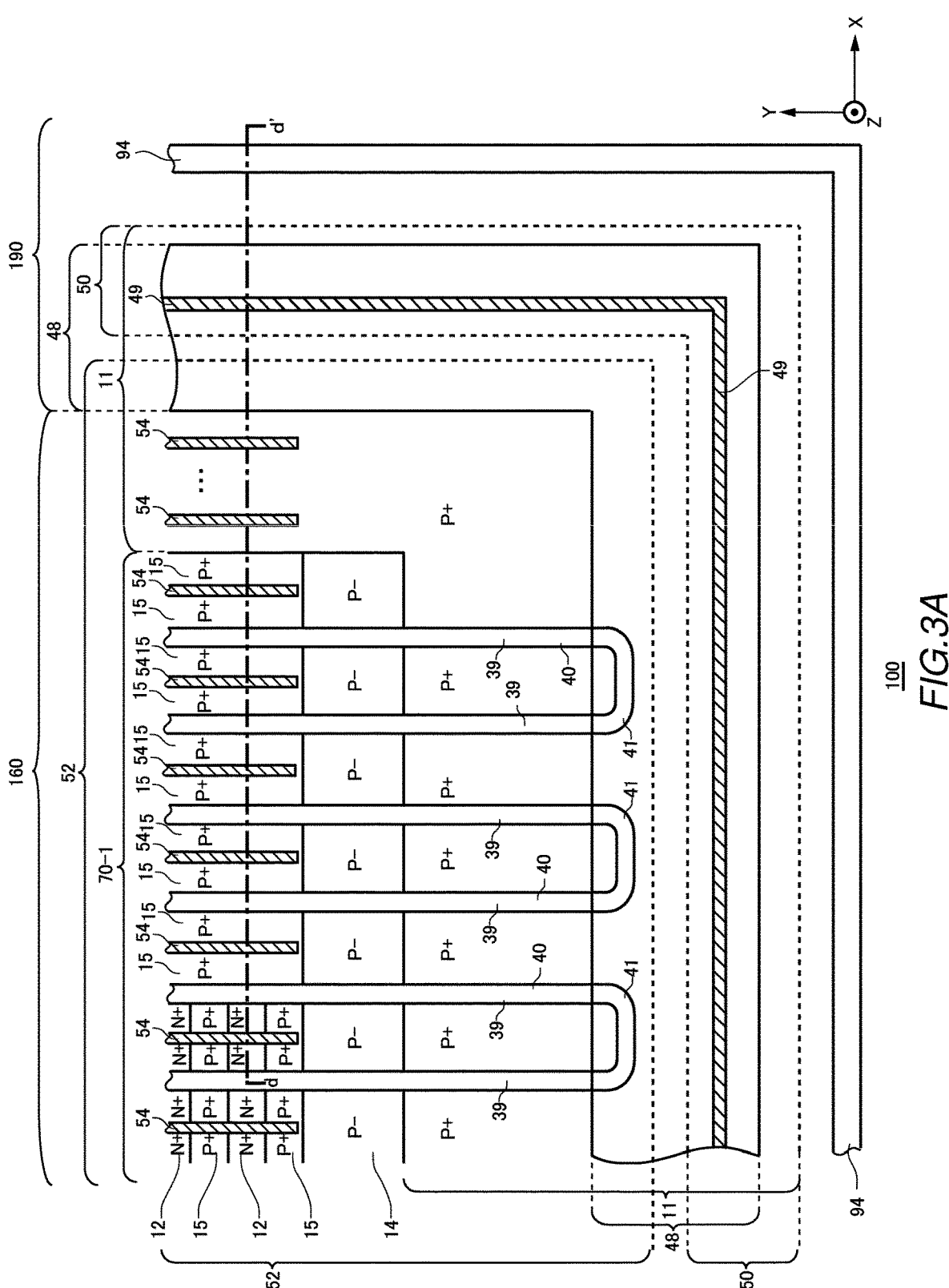
FIG. 3A is an enlarged view showing an example of a region B in FIG. 1.

FIG. 3A is an enlarged view showing an example of a region B in FIG. 1. Similar to the region shown in FIG. 2C, the region B is a region spanning the active region 160 and the edge termination structure portion 190. In FIG. 3A, an end portion region of the active region 160 in the X axis direction will be mainly described.

The well region 11 extends along an outer circumference of the active region 160 and is annularly provided in the top view. In the semiconductor device 100 of the present example, the transistor portion 70 and the diode portion 80 are alternately arrayed in the X axis direction, but the transistor portion 70 is arranged at the outermost side (end portion region on the positive side or the negative side) in the X axis direction. FIG. 3A shows an outermost transistor portion 70-1 on the positive side in the X axis direction. The transistor portion 70-1 is in contact with the well region 11 at an end portion on the positive side in the X axis direction and at end portions on both sides in the Y axis direction, in the top view.

In the transistor portion 70-1, the emitter region 12 is not provided in a region on the well region 11 side. In the transistor portion 70-1, the region where the emitter region 12 is not provided is provided with the contact regions 15 between the base regions 14 exposed on the front surface 21, from an end portion in the X axis direction to the fifth gate trench portion 40, for example.

Figure 3B:
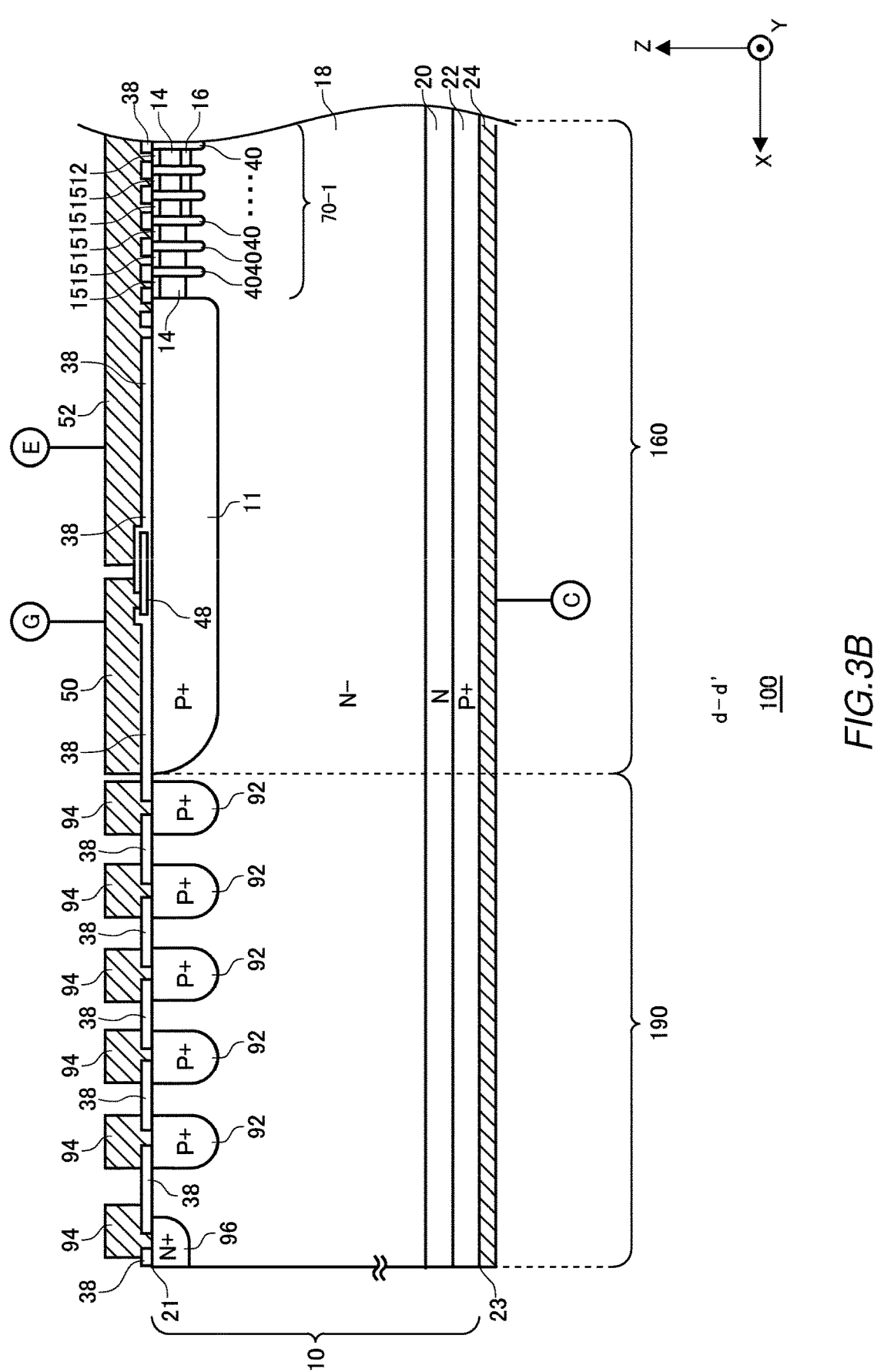
FIG. 3B shows a cross section d-d' in FIG. 3A.

FIG. 3B shows a cross section d-d' in FIG. 3A. The cross section d-d' is an XZ plane passing through the emitter region 12, the contact region 15, and the well region 11 and traversing the gate trench portion 40 in the array direction. In FIG. 3B, the outermost transistor portion 70-1 on the positive side in the X axis direction will be mainly described.

In the transistor portion 70-1, a region not adjacent to the well region 11 is provided with the emitter region 12 in contact with the front surface 21 above the base region 14. However, from the end portion in the X axis direction to the fifth gate trench portion 40, the contact regions 15 are provided instead of the emitter region 12.

In this way, on the well region 11 side of the transistor portion 70-1, the gate trench portion 40 not in contact with the emitter region 12 is invalidated (does not function as a transistor), and therefore, a gap is generated between an actual operation region of the transistor portion 70 (region functioning as a transistor) and the well region 11. In addition, by disturbing the periodicity of the array, the electric field concentration at the end portion of the active region 160 is reduced, and therefore, safety can be improved. Further, by providing the contact region 15 in the region where the emitter region 12 is not provided, it is possible to sweep away excess holes.

Note that, on the well region 11 side of the transistor portion 70-1, the trench bottom barrier region 75 may be provided above the drift region 18. When providing the trench bottom barrier region 75 on the well region 11 side of the transistor portion 70-1, the trench bottom barrier region may be formed by the same process as the process of providing the trench bottom barrier region 75 on the diode portion 80 side of the transistor portion 70-1 and in another transistor portion 70.

Figure 4:
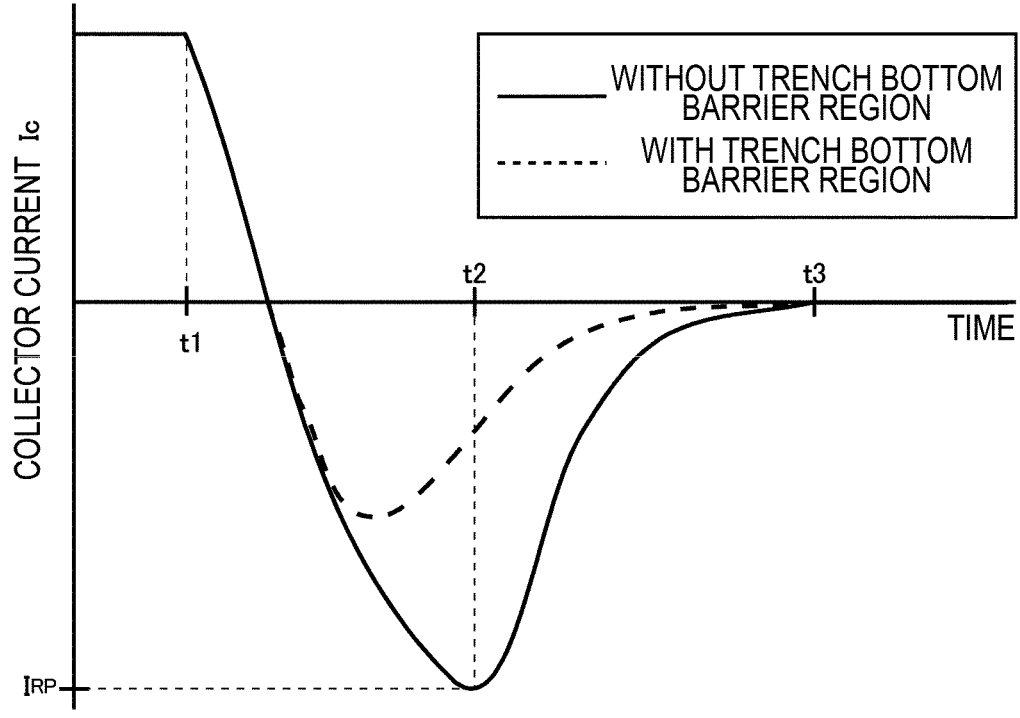
FIG. 4 is a graph showing a temporal change of a collector current Ic at the time of reverse recovery.

FIG. 4 is a graph showing a temporal change of a collector current Ic at the time of reverse recovery. In the graph of FIG. 4, the solid line represents a behavior of the collector current Ic in a semiconductor device without the trench bottom barrier region, and the broken line represents a behavior of the collector current Ic in the semiconductor device 100 of the present example having the trench bottom barrier region 75.

When the transistor portion is turned off at time t1 and the diode portion conducts, electron current flows from the cathode region to the base region serving as an anode layer, and a reverse recovery current is generated. When the electron current reaches the base region, conductivity modulation occurs and hole current flows from the anode layer. Further, the electron current is also diffused from the cathode region 82 into the base region 14 of the transistor portion.

The electron current diffused toward the transistor portion promotes hole injection from the contact region having a higher doping concentration than that of the base region, and increases a hole density of the semiconductor substrate. Therefore, it takes time for the holes to annihilate with the turn-off of the diode portion. For this reason, a reverse recovery peak current Irp increases, and reverse recovery loss becomes large.

Here, the collector current Ic in the semiconductor device without the trench bottom barrier region gradually decreases after reaching the reverse recovery peak current Irp at time t2, and becomes almost zero around time t3. When the reverse recovery peak current Irp is large, it takes time until the current becomes zero, so that heat generation increases and the reverse recovery loss increases.

On the other hand, the semiconductor device 100 of the present example has the trench bottom barrier region 75 in the region of the transistor portion 70 adjacent to the diode portion 80. Since the trench bottom barrier region 75 is electrically connected to the emitter electrode 52, the trench bottom barrier region suppresses hole injection and cuts off current.

Such trench bottom barrier region 75 covers the bottom portion of the gate trench portion 40, so that hole injection from the transistor portion 70 to the diode portion 80 is suppressed. In this way, in the semiconductor device 100 of the present example, the reverse recovery peak current Irp is smaller and the time until the current becomes zero is shortened, as compared with the semiconductor device without the trench bottom barrier region, so that the reverse recovery loss is reduced.

In the meantime, as a technology of suppressing the hole injection, it is known to provide a lifetime control region including a lifetime killer from a diode portion to a part of the transistor portion. The lifetime control region promotes hole annihilation at the time of turn-off and reduces the reverse recovery loss.

In general, the lifetime control region provided in the transistor portion needs to have a width of about 100 to 150 μm from the boundary on the diode portion side so as to annihilate holes injected at the time of turn-off. However, the region of the transistor portion, in which the lifetime control region is provided, becomes an invalid region that does not operate as a transistor.

In contrast, the trench bottom barrier region 75 of the present example may have a smaller width than that of the lifetime control region because it cuts off current and suppresses hole injection. In this way, the trench bottom barrier region 75 can improve element characteristics and suppress heat generation by reducing the invalid region, as compared with the case where the lifetime control region is provided in the transistor portion 70.

Figure 5A:
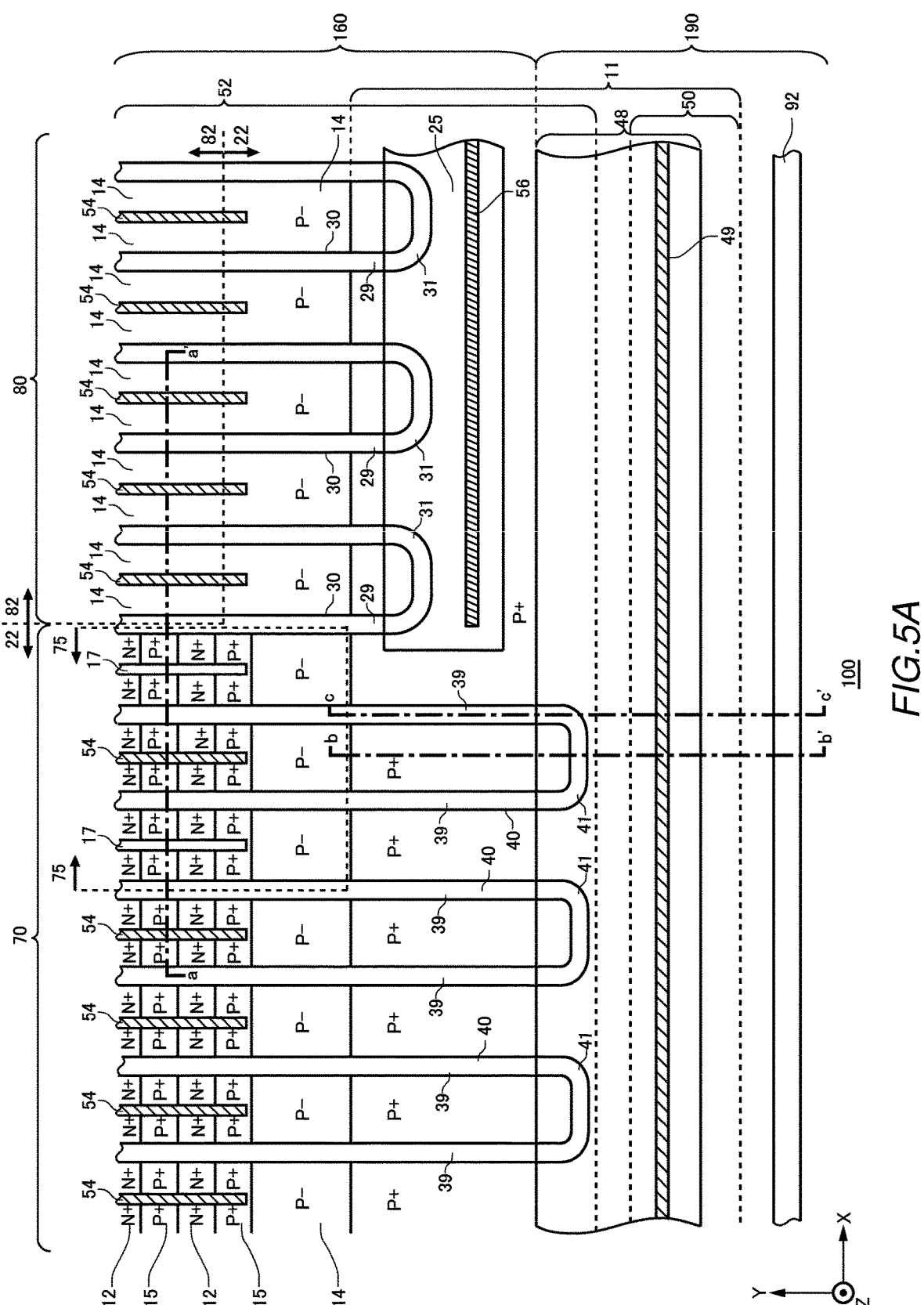
FIG. 5A is an enlarged view showing another example of the region A in FIG. 1.
Figure 5B:
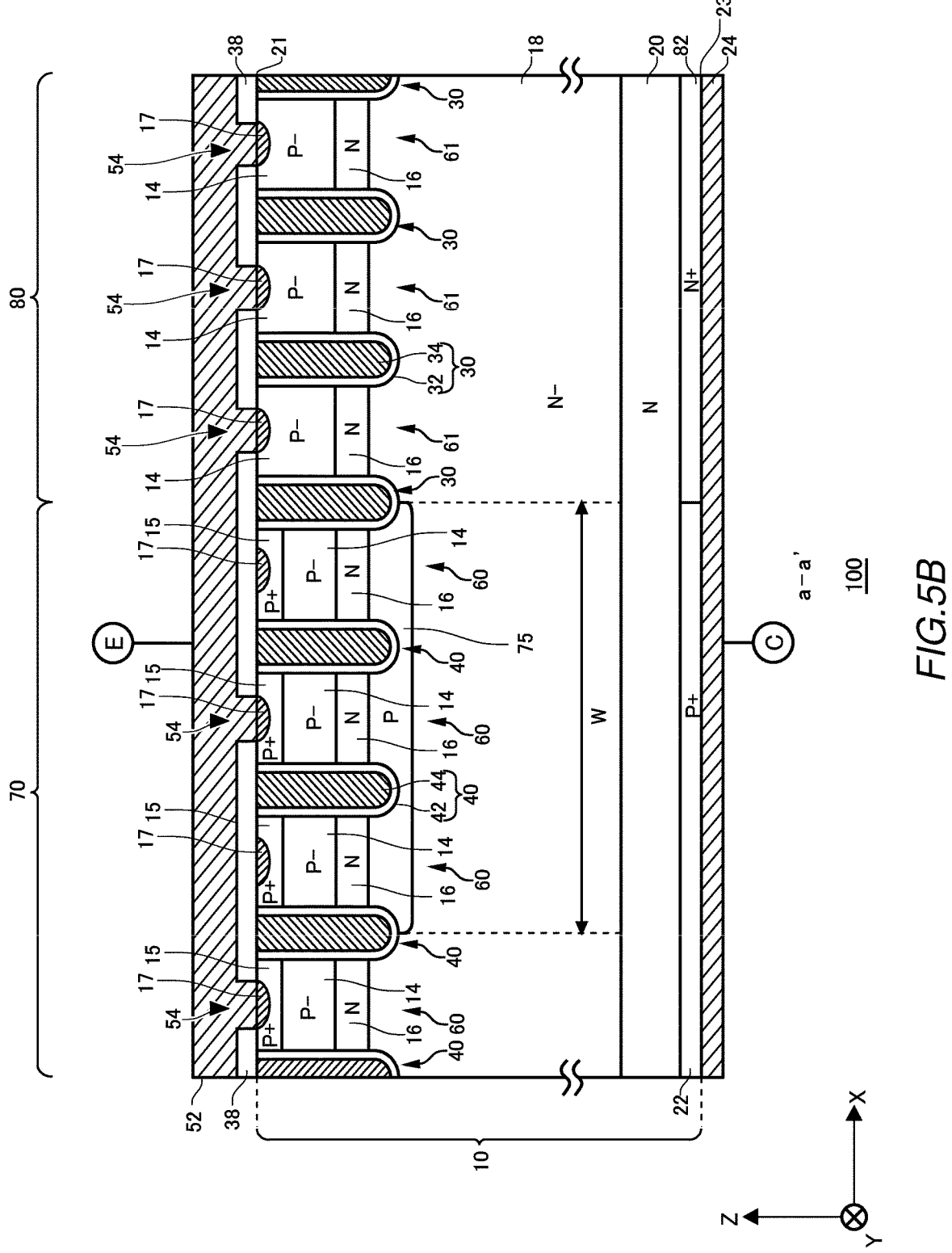
FIG. 5B shows a cross section a-a' in FIG. 5A.

FIG. 5A is an enlarged view showing another example of the region A in FIG. 1. FIG. 5B shows a cross section a-a' in FIG. 5A. Note that, a cross section b-b' and a cross section c-c' in FIG. 5A may be similar to those shown in FIGS. 2C and 2D, respectively, and therefore, the descriptions thereof are omitted here.

In the present example, in the region of the transistor portion 70 in which the trench bottom barrier region 75 is provided, the contact holes 54 are provided only above some of the mesa portions 60, and the contact hole 54 is not provided above the other mesa portions 60. In this respect, FIGS. 5A and 5B are different from FIGS. 2A and 2B in which the contact hole 54 is provided above each mesa portion. As shown in FIGS. 5A and 5B, only one contact hole 54 may be provided above the trench bottom barrier region 75.

That is, in the present example, among the plurality of mesa portions 60 positioned above the trench bottom barrier region 75, only some of the mesa portions 60 are electrically connected to the emitter electrode 52 via the contact holes 54, and the other mesa portions 60 are covered with the interlayer dielectric film 38.

In this way, only some of the plurality of mesa portions 60 positioned above the trench bottom barrier region 75 are electrically connected to the emitter electrode 52, and are made to have a hole extraction effect, thereby promoting hole annihilation at the time of turn-off and reducing the reverse recovery loss.

Figure 6A:
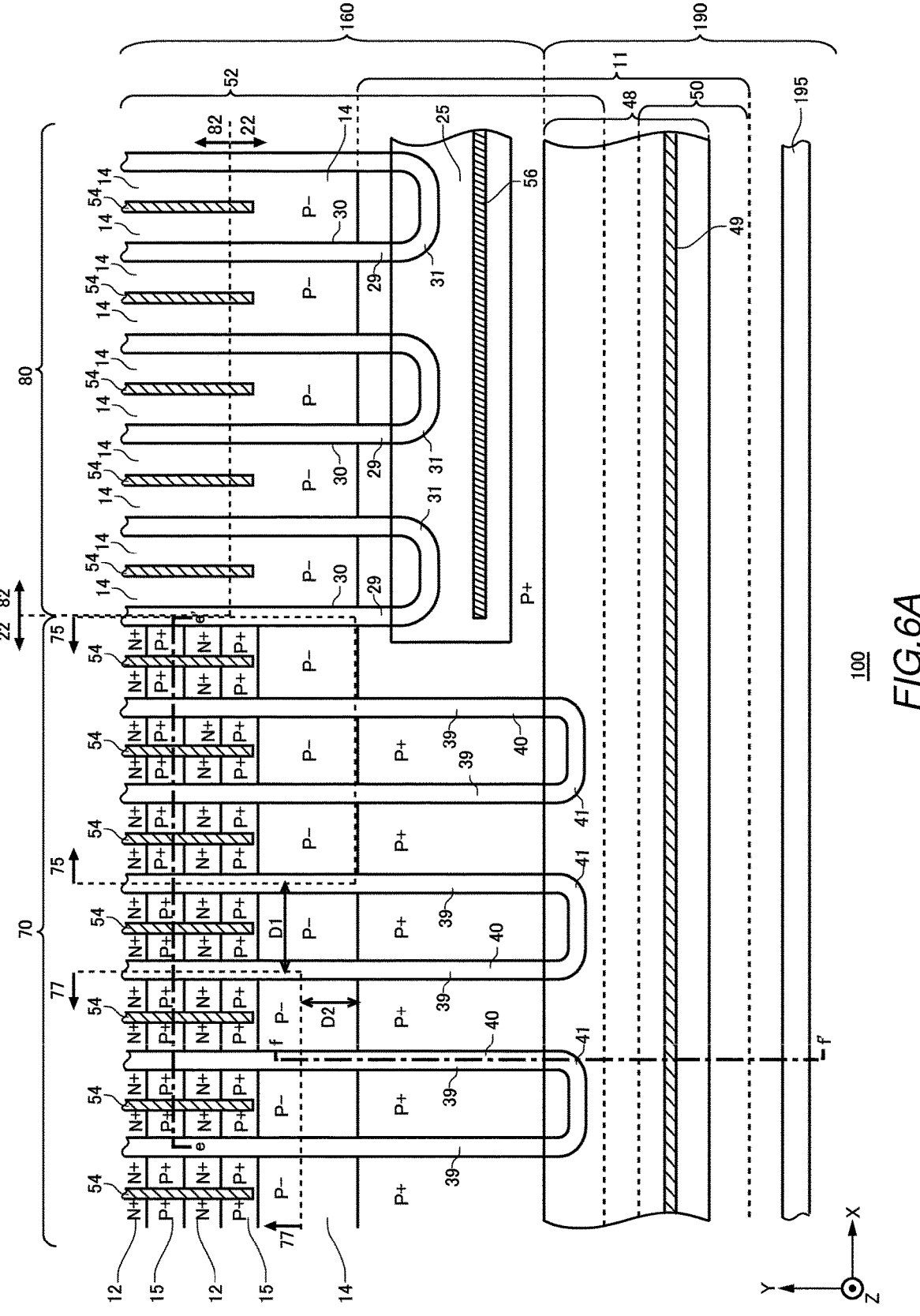
FIG. 6A is an enlarged view showing another example of the region A in FIG. 1.

FIG. 6A is an enlarged view showing another example of the region A in FIG. 1. The semiconductor device 100 of the present example has a floating barrier region 77 in the transistor portion 70. Here, the descriptions of elements common to FIG. 2A are omitted.

The floating barrier region 77 is an electrically floating region of a second conductivity type provided between the drift region 18 and the base region 14. In FIG. 6A, a range of the floating barrier region 77 is indicated by a dotted line.

"Electrically floating" means not being electrically connected to a predetermined potential such as the emitter electrode 52. The floating barrier region 77 is spaced from the trench bottom barrier region 75 and the well region 11, in the top view of the semiconductor substrate 10. The trench bottom barrier region 75 and the well region 11 are electrically connected to the emitter electrode 52.

The floating barrier region 77 of the present example is P type. A doping concentration of the floating barrier region 77 is higher than that of the base region 14. The doping concentration of the floating barrier region 77 may be the same as that of the trench bottom barrier region 75. The floating barrier region 77 may be formed by the same process as the process of providing the trench bottom barrier region 75.

When the transistor portion 70 is turned on, a temporal change dV/dt of a voltage in the diode portion 80 depends on a gate resistance Rg of the transistor portion 70. In the present example, by providing the floating barrier region 77 in the transistor portion, the dependence of dV/dt on the gate resistance Rg is reduced, i.e., drive with a small gate resistance Rg is possible. When the gate resistance Rg becomes small, the power consumption at the time of turn-on is reduced.

Figure 6B:
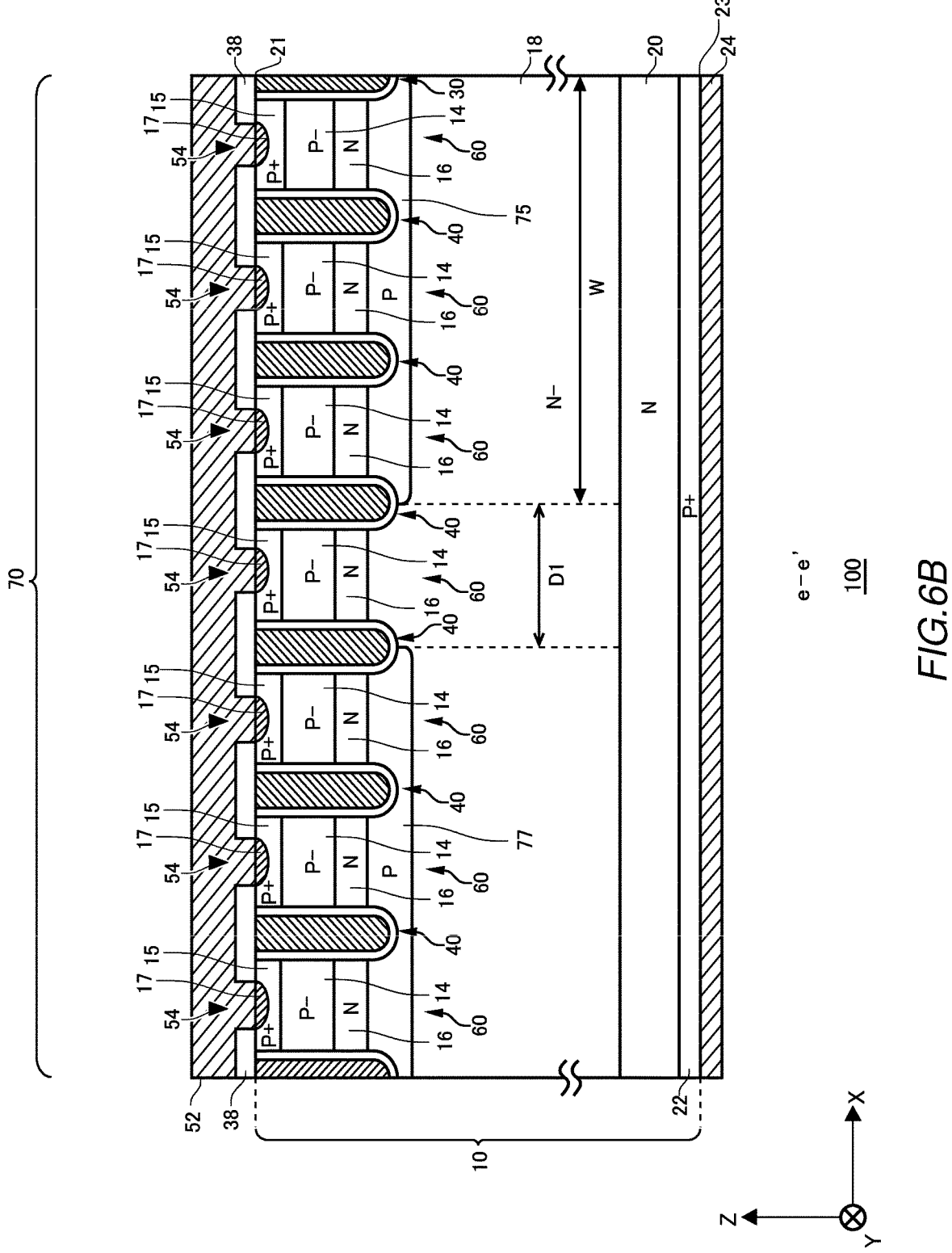
FIG. 6B shows a cross section e-e' in FIG. 6A.

FIG. 6B shows a cross section e-e' in FIG. 6A. In the transistor portion 70, the trench bottom barrier region 75 is provided in a region adjacent to the diode portion 80, and the floating barrier region 77 is further provided apart from the trench bottom barrier region 75.

In the X axis direction, a distance D1 between the trench bottom barrier region 75 and the floating barrier region 77 may be equal to or greater than a pitch of the gate trench portions 40 and 10 μm or less. Here, the pitch of the gate trench portions 40 refers to a distance between the gate trench portions 40. The pitch of the gate trench portions 40 is, for example, 2.3 μm.

In the depth direction of the semiconductor substrate 10, the floating barrier region 77 is provided below the accumulation region 16. A lower end of the floating barrier region 77 is positioned below the bottom portion of the gate trench portion 40. That is, the floating barrier region 77 is configured to cover the bottom portion of the gate trench portion 40, similar to the trench bottom barrier region 75. The depth direction position of the floating barrier region 77 may be the same as the depth direction position of the trench bottom barrier region 75.

Figure 6C:
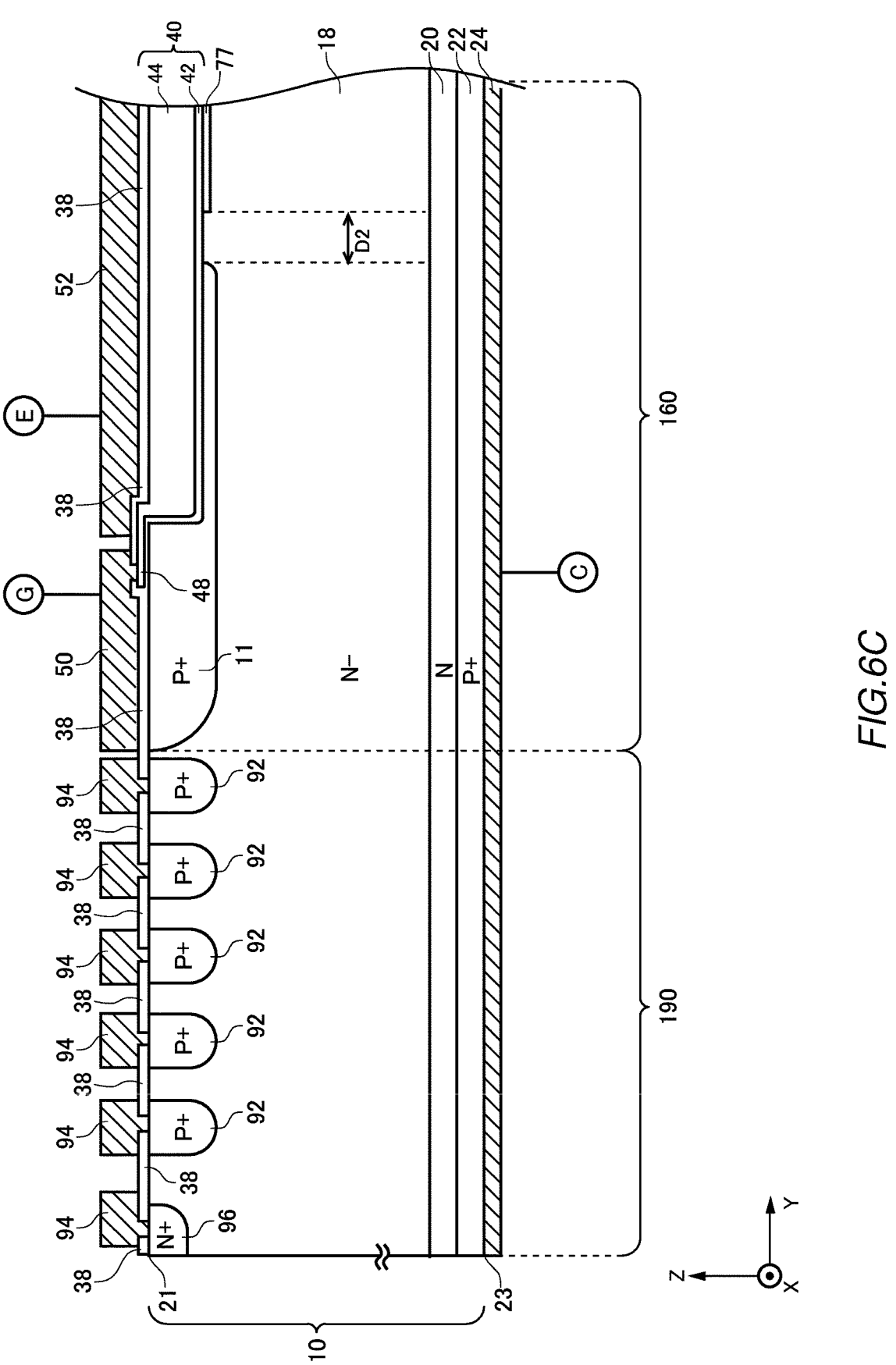
FIG. 6C shows a cross section f-f in FIG. 6A.

FIG. 6C shows a cross section f-f in FIG. 6A. The floating barrier region 77 is spaced from the well region 11. A depth of the bottom portion of the well region 11 may be deeper than a lower end of the floating barrier region 77. In the Y axis direction, a distance D2 between the well region 11 and the floating barrier region 77 may be equal to or greater than the pitch of the gate trench portions 40 and 10 μm or less.

In this way, the floating barrier region 77 of the present example is spaced from the trench bottom barrier region 75 and the well region 11 of the emitter potential so as not to be affected while ensuring a sufficient area. Thereby, the floating barrier region 77 reduces the dependence of dV/dt on the gate resistance Rg in the diode portion 80, and enables drive with a small gate resistance Rg, thereby improving turn-on characteristics.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 14: base region, 15: contact region, 16: accumulation region, 17: plug region, 18: drift region, 20: buffer region, 21: front surface, 22: collector region, 23: rear surface, 24: collector electrode, 25: connection portion, 29: linear portion, 30: dummy trench portion, 31: edge portion, 32: dummy dielectric film, 34: dummy conductive portion, 38: interlayer dielectric film, 39: linear portion, 40: gate trench portion, 41: edge portion, 42: gate dielectric film, 44: gate conductive portion, 48: gate runner, 49: contact hole, 50: gate metal layer, 52: emitter electrode, 54: contact hole, 56: contact hole, 60: mesa portion, 61: mesa portion, 70: transistor portion, 75: trench bottom barrier region, 77: floating barrier region, 80: diode portion, 82: cathode region, 92: guard ring, 94: field plate, 96: channel stopper, 100: semiconductor device, 102: end side, 160: active region, 190: edge termination structure portion

What is claimed is:

1. A semiconductor device comprising:
a semiconductor substrate having a transistor portion and a diode portion; and
an emitter electrode and a gate electrode provided above a front surface of the semiconductor substrate, wherein the transistor portion has:
a plurality of trench portions electrically connected to the gate electrode;
a drift region of a first conductivity type provided in the semiconductor substrate;
a base region of a second conductivity type provided above the drift region; and a trench bottom barrier region of a second conductivity type provided between the drift region and the base region and having a higher doping concentration than that of the base region, and
the trench bottom barrier region is electrically connected to the emitter electrode, wherein
in a depth direction of the semiconductor substrate, a lower end of the trench bottom barrier region is positioned below bottom portions of the plurality of trench portions.

2. The semiconductor device according to claim 1, wherein
the trench bottom barrier region is provided in a region adjacent to the diode portion, in a top view of the semiconductor substrate.

3. The semiconductor device according to claim 2, wherein
a width of the trench bottom barrier region in an array direction of the plurality of trench portions is 2 μm or more and 100 μm or less.

4. The semiconductor device according to claim 3, wherein
the width of the trench bottom barrier region is 10 μm or more and 50 μm or less.

5. The semiconductor device according to claim 3, wherein
the doping concentration of the trench bottom barrier region is 1E11 cm$^{-3}$ or more and 1E13 cm$^{-3}$ or less.

6. The semiconductor device according to claim 2, wherein
the doping concentration of the trench bottom barrier region is 1E11 cm$^{-3}$ or more and 1E13 cm$^{-3}$ or less.

7. The semiconductor device according to claim 2, wherein
the transistor portion has an accumulation region of a first conductivity type provided above the trench bottom barrier region and having a higher doping concentration than that of the drift region.

8. The semiconductor device according to claim 2, wherein the transistor portion further has:
a well region of a second conductivity type provided on the front surface of the semiconductor substrate and extending along an outer circumference of an active region; and
an interlayer dielectric film provided above the semiconductor substrate, the trench bottom barrier region is connected to the well region, and the well region is electrically connected to the emitter electrode.

9. The semiconductor device according to claim 1, wherein
the doping concentration of the trench bottom barrier region is 1E11 cm$^{-3}$ or more and 1E13 cm$^{-3}$ or less.

10. The semiconductor device according to claim 1, wherein
the transistor portion has an accumulation region of a first conductivity type provided above the trench bottom barrier region and having a higher doping concentration than that of the drift region.

11. The semiconductor device according to claim 10, wherein
the drift region and the accumulation region are further provided to the diode portion.

12. The semiconductor device according to claim 1, wherein
the transistor portion further has:
a well region of a second conductivity type provided on the front surface of the semiconductor substrate and extending along an outer circumference of an active region; and
an interlayer dielectric film provided above the semiconductor substrate, the trench bottom barrier region is connected to the well region, and the well region is electrically connected to the emitter electrode.

13. The semiconductor device according to claim 12, wherein
some of a plurality of mesa portions positioned above the trench bottom barrier region are electrically connected to the emitter electrode via a contact hole provided in the interlayer dielectric film.

14. The semiconductor device according to claim 13, wherein
the transistor portion further has a floating barrier region of a second conductivity type provided between the drift region and the base region and electrically floating.

15. The semiconductor device according to claim 12, wherein
the transistor portion further has a floating barrier region of a second conductivity type provided between the drift region and the base region and electrically floating.

16. The semiconductor device according to claim 15, wherein
in an array direction of the plurality of trench portions, a distance between the trench bottom barrier region and the floating barrier region is equal to or greater than a pitch of the plurality of trench portions and 10 μm or less.

17. The semiconductor device according to claim 16, wherein
in an extension direction of the plurality of trench portions, a distance between the well region and the floating barrier region is equal to or greater than the pitch and 10 μm or less.

18. A semiconductor device comprising:

a semiconductor substrate having a front surface, a transistor portion and a diode portion; and an emitter electrode and a gate electrode provided above the front surface of the semiconductor substrate, wherein the transistor portion has:

a plurality of trench portions electrically connected to the gate electrode;

a drift region of a first conductivity type provided in the semiconductor substrate;

a base region of a second conductivity type provided above the drift region;

an emitter region of the first conductivity type having an upper surface coincident with the front surface of the semiconductor substrate; and a trench bottom barrier region of a second conductivity type provided between the drift region and the base region and having a higher doping concentration than that of the base region, and the trench bottom barrier region is electrically connected to the emitter electrode, wherein the transistor portion further has:

a well region of a second conductivity type provided on the front surface of the semiconductor substrate and extending along an outer circumference of an active region, wherein the emitter region is not provided on the well region; and an interlayer dielectric film provided above the semiconductor substrate, the trench bottom barrier region is connected to the well region, and the well region is electrically connected to the emitter electrode.

19. A semiconductor device comprising:

a semiconductor substrate having a front surface, a transistor portion and a diode portion; and an emitter electrode and a gate electrode provided above the front surface of the semiconductor substrate, wherein the transistor portion has:

a plurality of trench portions electrically connected to the gate electrode;

a drift region of a first conductivity type provided in the semiconductor substrate;

a base region of a second conductivity type provided above the drift region;

an emitter region of the first conductivity type having an upper surface coincident with the front surface of the semiconductor substrate; and a trench bottom barrier region of a second conductivity type provided between the drift region and the base region and having a higher doping concentration than that of the base region, and the trench bottom barrier region is electrically connected to the emitter electrode, wherein the transistor portion further has:

a well region of a second conductivity type provided on the front surface of the semiconductor substrate and extending along an outer circumference of an active region, wherein the emitter region is not provided on the well region; and an interlayer dielectric film provided above the semiconductor substrate, the trench bottom barrier region is connected to the well region, the well region is electrically connected to the emitter electrode, and the trench bottom barrier region is provided in a region adjacent to the diode portion, in a top view of the semiconductor substrate.

* * * * *